(12) United States Patent  
Mo

(10) Patent No.: US 8,749,049 B2  
(45) Date of Patent: Jun. 10, 2014

(54) CHIP PACKAGE WITH A CHIP EMBEDDED IN A WIRING BODY

(75) Inventor: Zhimin Mo, Lund (SE)

(73) Assignee: ST-Ericsson SA, Plan-les-Ouates (CH)

( * ) Notice: Subject to any disclaimer, the term of this patent is extended or adjusted under 35 U.S.C. 154(b) by 28 days.

(21) Appl. No.: 13/497,344

(22) PCT Filed: Aug. 27, 2010

(86) PCT No.: PCT/EP2010/062577  
§ 371 (c)(1),  
(2), (4) Date: Jul. 19, 2012

(87) PCT Pub. No.: WO2011/042256  
PCT Pub. Date: Apr. 14, 2011

(65) Prior Publication Data  
US 2012/0273947 A1 Nov. 1, 2012

Related U.S. Application Data

(60) Provisional application No. 61/250,639, filed on Oct. 12, 2009.

(30) Foreign Application Priority Data

Oct. 9, 2009 (EP) .................................... 09172721

(51) Int. Cl.  
*H01L 23/04* (2006.01)  
*H01L 21/00* (2006.01)

(52) U.S. Cl.  
USPC ........... 257/698; 257/690; 257/693; 257/697; 257/700; 257/E23.019; 257/E23.02; 257/E23.067; 257/E21.504; 438/127

(58) Field of Classification Search  
USPC .................................................. 257/698, 700  
See application file for complete search history.

(56) References Cited

U.S. PATENT DOCUMENTS 7,429,786 B2 9/2008 Karnezos et al.

7,485,562 B2 2/2009 Chua et al.  
(Continued)

FOREIGN PATENT DOCUMENTS

DE 10 2004 058395 A1 6/2006  
JP 2007141994 A 6/2007  
(Continued)

OTHER PUBLICATIONS

European Office Action dated Apr. 13, 2012 in corresponding European Patent Application No. 09 172 721.4-2203.

(Continued)

*Primary Examiner* — Jasmine Clark  
(74) *Attorney, Agent, or Firm* — Patent Portfolio Builders PLLC

(57) ABSTRACT

An electronic device is disclosed. The electronic device comprises at least one electronic chip and a package for the electronic chip. The package comprises a laminate substrate, wherein the electronic chip is attached on the laminate substrate. The laminate substrate comprises one or more conduction layers, one or more insulation layers and a plurality of pads formed in a conduction layer on the side of the laminate substrate opposite to the side connected to the electronic chip. Furthermore, the package comprises an insulation body formed around the electronic chip. Moreover, the package comprises a plurality of electrodes that extend through the insulation body. For each pad of the laminate substrate, wiring is formed in the one or more conduction layers and in one or more vias passing through the one or more insulation layers for electrically connecting the pad with at least one of the electrodes. The package further comprises an interconnection body formed on the insulation body and the electronic chip. The interconnection body comprises a plurality of pads on the side of the interconnection body opposite to the side connected to the insulation body and the electronic chip and it also comprises wiring inside the interconnection body for electrical connections between the pads of the electronic chip, the electrodes and the pads of the interconnection body. A method for manufacturing the electronic device is also disclosed.

17 Claims, 6 Drawing Sheets

(56) References Cited

U.S. PATENT DOCUMENTS

| | | |
|---|---|---|
| 7,884,464 B2 * | 2/2011 | Yew et al. .................. 257/698 |
| 2003/0157747 A1 | 8/2003 | Chen et al. |
| 2006/0079027 A1 | 4/2006 | Yamada et al. |
| 2007/0096292 A1 * | 5/2007 | Machida .................. 257/700 |
| 2007/0278660 A1 | 12/2007 | Han et al. |
| 2007/0296065 A1 | 12/2007 | Yew et al. |
| 2008/0017970 A1 | 1/2008 | Yu |
| 2008/0036065 A1 | 2/2008 | Brunnbauer et al. |
| 2008/0230886 A1 | 9/2008 | Wong et al. |
| 2008/0264681 A1 | 10/2008 | Iwai et al. |
| 2008/0303136 A1 | 12/2008 | Mori et al. |
| 2009/0072381 A1 | 3/2009 | Ishihara et al. |
| 2009/0079090 A1 | 3/2009 | Pressel et al. |
| 2010/0044845 A1 | 2/2010 | Funaya et al. |
| 2010/0103634 A1 | 4/2010 | Funaya et al. |

FOREIGN PATENT DOCUMENTS

| | | |
|---|---|---|
| WO | 2007126090 A1 | 11/2007 |
| WO | 2008120755 A1 | 10/2008 |

OTHER PUBLICATIONS

International Search Report issued in corresponding International Application No. PCT/EP2010/062577, mailing date Sep. 24, 2010.

A. Ostmann et al.: "Realization of a Stackable Package Using Chip in Polymer Technology", Polymers and Adhesives in Microelectronics and Photonics, 2002, Polytronic 2002, 2nd International IEEE Conference, Jun. 23-26, 2002, Piscataway, NJ, USA, IEEE, Jun. 23, 2002, pp. 160-164, XP010594250, ISBN: 978-0/7803-7567-3, entire document.

* cited by examiner

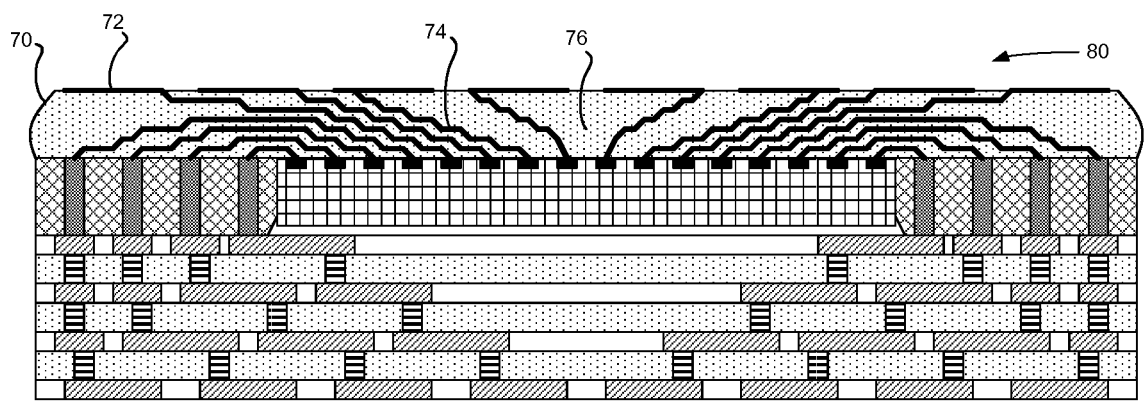
Fig. 7
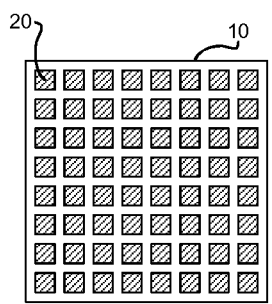
Fig. 8a
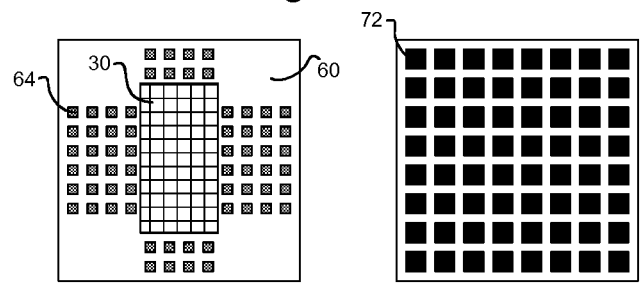
Fig. 8b
Fig. 8c

CHIP PACKAGE WITH A CHIP EMBEDDED IN A WIRING BODY

TECHNICAL FIELD

The present invention relates to an electronic device comprising an electronic chip and a package for the electronic chip. Moreover, the present invention relates to a method for manufacturing the electronic device.

BACKGROUND

Electronic chips, such as semiconductor chips, have evolved continuously towards higher functionality and integration. As a consequence, the number of input/output (I/O) interconnects of packages for such chips have increased. Electronics packages have evolved from dual in-line packages (DIPs) with I/Os along two edges of the package and quad flat packages (QFPs) with I/Os along all four edges of the package to ball grid arrays (BGAs) with I/Os at the whole bottom surface, in order to arrange more I/Os with acceptable pitch (or distance between neighboring I/Os).

A next step in packaging technology is the so called 3D (3 Dimensional) packaging technique, where I/Os are on both the top and the bottom surfaces of the package, such that components can be stacked on top of each other on a printed circuit board (PCB), thereby saving space compared with e.g. components mounted side by side on a PCB. For example, US 2007/0296065 A1 discloses a 3-dimensional electronic packaging unit having a conductive supporting substrate that can achieve multi-chip stacking through the signal contacts on the both sides of the unit.

Although the 3D packaging technology described above provides an improved utilization of space e.g. compared with electronic devices mounted side by side on a PCB, it is desirable to provide electronic packaging technology with even further improved utilization of space.

SUMMARY

An object of the present invention is to provide for packaging of electronic chips with a relatively efficient utilization of space.

According to a first aspect, there is provided an electronic device. The electronic device comprises at least one electronic chip having interconnection pads on a first side of the electronic chip. The electronic device further comprises a package for the electronic chip. The package comprises a laminate substrate made from a laminate of one or more conduction layers comprising electrically conductive material and one or more insulation layers of dielectric material. The electronic chip is attached on a first side and in a first area of the laminate substrate with a second side of the electronic chip, opposite to the first side of the electronic chip, facing the first side of the laminate substrate. The laminate substrate comprises a plurality of pads formed in the conduction layer of the laminate substrate on a second side of the laminate substrate, opposite to the first side of the laminate substrate. The package further comprises an insulation body of electrically insulating material formed on the first side of the laminate substrate around the electronic chip. A first surface of the insulation body is essentially coplanar with the first side of the electronic chip. Furthermore, the package comprises a plurality of electrodes of electrically conductive material formed on the first side and in a second area of the laminate substrate. The second area is outside the first area. The electrodes extend through the insulation body. Moreover, for each pad of said plurality of pads of the laminate substrate, the package comprises wiring formed in one or more of the conduction layers of the laminate substrate and one or more electrically conductive vias passing through one or more of the insulation layers of the laminate substrate for electrically connecting the pad with at least one of the electrodes. In addition, the package comprises an interconnection body formed on the first surface of the insulation body and the first side of the electronic chip. The interconnection body comprises a plurality of pads on a side of the interconnection body opposite to the side of the interconnection body that faces the electronic chip and the insulation body, and wiring for electrical connections among the pads of the electronic chip, the electrodes, and the pads of the interconnection body.

The interconnection body may be formed using a thin-film process for generating said pads of the interconnection body, said wiring of the interconnection body, and electrically insulating material of the interconnection body.

At least one of the insulation layers of the laminate substrate may comprise a polymer resin material. The polymer resin material may be reinforced.

The polymer resin material may e.g. comprise Ajinomoto Build-up Film (ABF), benzocyclobutene (BCB), bismaleimide-triazine (BT), epoxy, polyester, polyimide, and/or TEFLON.

The laminate substrate may be formed using an organic ball-grid array (BGA) substrate manufacturing process.

The insulation body may be transfer molded.

The electronic device may further comprise solder balls attached to one or more pads of the interconnection body and/or one or more pads of the laminate substrate.

According to a second aspect, an electronic apparatus comprises a first electronic device according to the first aspect. The electronic apparatus may further comprise a printed circuit board (PCB) and a second electronic device according to the first aspect. The first electronic device may be mounted on the PCB, and the second electronic device may be mounted on the first electronic device in a 3D packaging fashion. The electronic apparatus may e.g. be, but is not limited to, a portable electronic apparatus, a mobile telephone, a computer, a portable media player, a satellite navigation device, a pager, a communicator, an electronic organizer, a smart phone, or a personal digital assistant (PDA).

According to a third aspect, there is provided a method for manufacturing the electronic device according to the first aspect. The method comprises attaching the electronic chip to the laminate substrate. The method further comprises forming the insulation body with molding. Furthermore, the method comprises providing holes through the insulation body at the locations where the electrodes are to be formed. Moreover, the method comprises generating the electrodes by supplying the electrically conductive material thereof in said holes provided in the insulation body. In addition, the method comprises forming the interconnection body by repeatedly performing thin-film deposition, or plating, and selective removal of alternately dielectric and electrically conductive materials.

Supplying the electrically conductive material of the electrodes may comprise supplying the electrically conductive material with plating or sputtering.

The method may further comprise attaching solder balls to one or more pads of the interconnection body and/or one or more pads of the laminate substrate.

The method may comprise forming the laminate substrate using an organic BGA substrate manufacturing process.

Forming the insulation body with molding may comprise placing the laminate substrate with the electronic chip attached thereto in a transfer mold and injecting a molding compound into the transfer mold for forming the insulation body.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which:

FIGS. 1-9 show various views of an electronic device or parts thereof according to embodiments of the present invention.

DETAILED DESCRIPTION

In the following, embodiments of the present invention are described with reference to the drawings. It should be emphasized that, in order to facilitate illustration of objects with considerably different dimensions in the same figure, the features illustrated in drawings are not drawn to scale.

Figure 1:
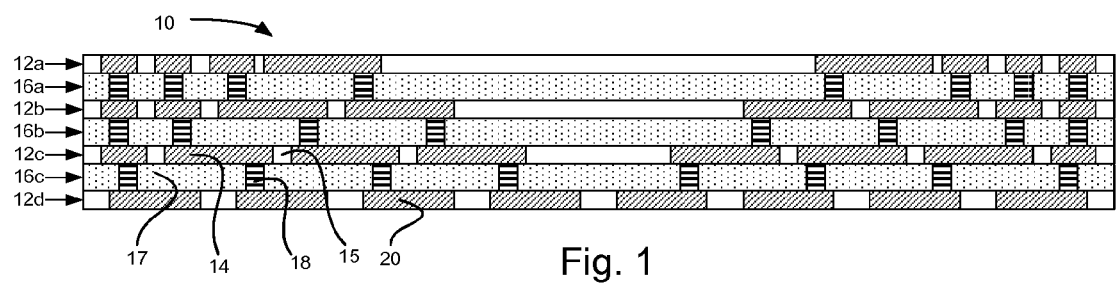

According to an embodiment of the present invention, the manufacturing of an electronic device 80 (FIGS. 6-7) is performed as is described below with reference to FIGS. 1-7. The electronic device 80 is in the form of an electronic chip 30, such as a semiconductor chip and a package for the electronic chip. Such an electronic device may e.g. be mounted on a printed circuit board (PCB) or stacked on top of another such electronic device 80 in a 3D (3 Dimensional) packaging fashion. According to the embodiment, the manufacturing starts with a laminate substrate 10 (which is part of the package), which is illustrated with a cross-sectional view in FIG. 1. The laminate substrate 10 is made from a laminate comprising one or more than one conduction layers 12a-d. Each of the conduction layers 12a-d comprises electrically conductive material 14. The electrically conductive material may e.g., be a metal, such as copper, or a metal alloy. As illustrated in FIG. 1, the conduction layers 12a-d are not completely filled with the electrically conductive material 14. Instead, the electrically conductive material 14 is used to form wires in the conduction layers 12a-d, wherein said wires are separated with areas within the conduction layers where the electrically conductive material is absent. Absence of electrically conductive material in the conduction layers 12a-d is illustrated in FIG. 1 with white spaces 15.

The laminate substrate 10 further comprises one or more than one insulation layers 16a-c of dielectric material. In the case of multiple conduction layers 12a-d, the conduction layers 12a-d are separated by the insulation layers 16a-c of dielectric material 17. One or more of the insulation layers 16a-c may comprise a polymer resin material. For example, the polymer resin material may be or comprise Ajinomoto Build-up Film (ABF), benzocyclobutene (BCB), bismaleimide-triazine (BT), epoxy, polyester, polyimide, and/or TEFLON. Furthermore, one ore more of the insulation layers 16a-c may comprise a reinforcement, such as a fiber glass reinforcement, for the polymer resin material.

The laminate substrate 10 further comprises electrically conductive vias 18 passing through the insulation layers 16a-c of the laminate substrate 10. The vias are made from an electrically conductive material, such as a metal or metal alloy. The vias provide electrical connections between different conduction layers.

Pads 20 for providing an electrical connection between the electronic device and other components are formed in the conduction layer 12d on one side of the laminate substrate 10.

The laminate substrate 10 may be the same kind of organic substrates used in ballgrid array (BGA) packages. Hence, the laminate substrate 10 may be formed using a similar manufacturing process as used for manufacturing BGA substrates. For example, the manufacturing process may start with a laminate comprising a single dielectric substrate with a metal layer on one or both sides. Wiring is formed by selectively removing metal by etching. Vias are formed by drilling holes through the laminate and filling at least part of each hole with electrically conductive material. More such dielectric and metal layers may be laminated together, e.g., with hot pressing, to form a laminate substrate 10 having more than two conduction layers 12a-d. BGA substrate manufacturing processes are known in the art and are therefore not further described herein.

Figure 2:
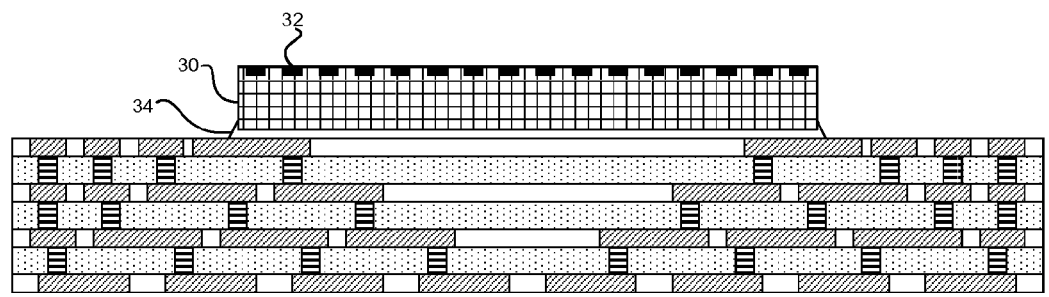

As illustrated in FIG. 2, an electronic chip 30, such as a semiconductor chip, is then attached to the laminate substrate 10 on the side opposite to the pads 20 of the laminate substrate. The electronic chip 30 is in the following simply referred to as the chip 30. The chip 30 may have any type of electronic functionality, e.g., analog and/or digital, and the present invention is not limited to any particular such functionality. The area of the laminate substrate 10 in which the chip 30 is attached is in the following referred to as the chip area. In embodiments described below, a single chip 30 is attached within the chip area of the laminate substrate 10. However, in other embodiments, more than one chip 30 may be attached within the chip area of the laminate substrate 10. The chip 30 has interconnection pads 32 on one side of the chip 30. The chip 30 is attached to the laminate substrate 10 such that the side of the chip 30 that comprises the pads 32 faces away from the laminate substrate 10. The chip 30 may e.g., be attached to the laminate substrate with any suitable adhesive 34.

Figure 3:
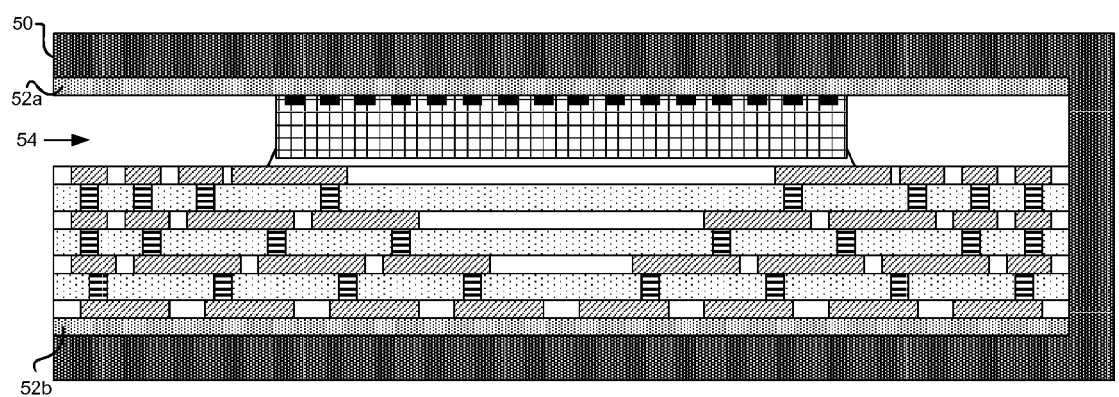
Figure 4:
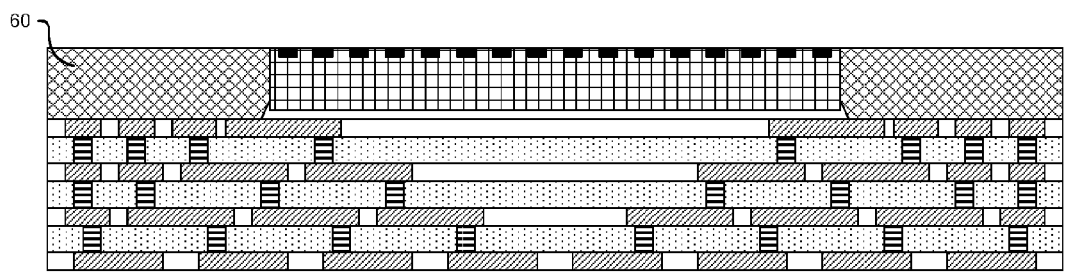

In a next step, illustrated in FIG. 3, the laminate substrate 10 with the chip 30 attached thereto is placed in a transfer mold 50. Surfaces of the transfer mold 50 are covered with sealing films 52a-b. A molding compound of electrically insulating material, such as silica filled epoxy resin, is then injected into an opening 54 of the transfer mold 50 for forming an insulation body 60 further illustrated in FIG. 4. The insulation body 60 of electrically insulating material is formed on the same side of the laminate substrate 10 as the chip 30 is attached to and around the chip 30. The surface of the insulation body 60 facing away from the laminate substrate 10 is essentially coplanar with the side of the electronic chip 30 that is facing away from the laminate substrate 10. Due to the sealing films 52a-b, the pads 20 of the laminate substrate and the pads 32 of the chip 30 are not covered with the molding compound during transfer molding. Hence, the pads 20 of the laminate substrate and the pads 32 of the chip 30 are freely exposed.

Figure 5:
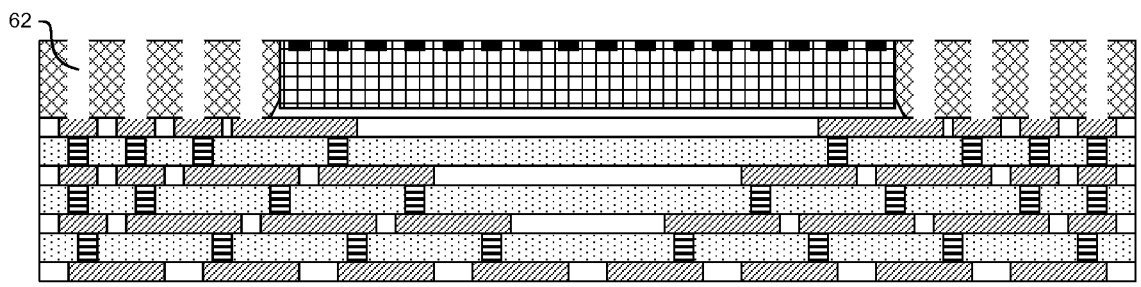

Subsequently, as illustrated in FIG. 5, holes 62 are formed through the insulation body 60. The holes 62 may be formed e.g. by mechanical drilling or laser drilling.

Figure 6:
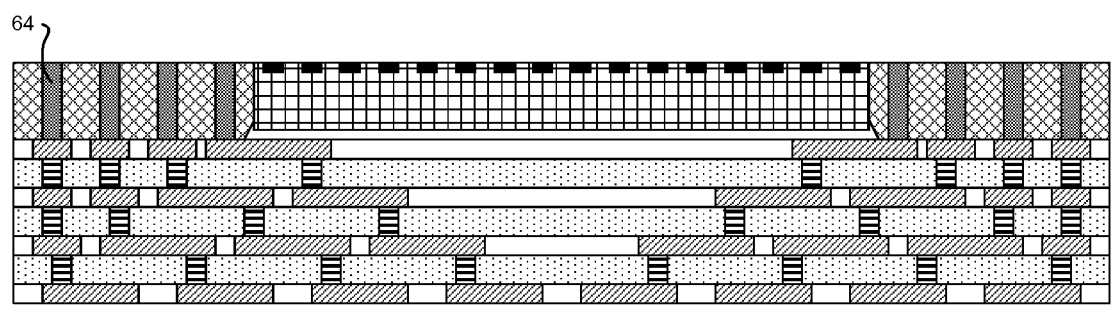

In a next step, illustrated in FIG. 6, a plurality of electrodes 64 are generated by supplying the electrically conductive material in the holes 62 provided in the insulation body 60. The electrically conductive material of the electrodes 64 may be a metal, such as copper, or a metal alloy. The electrically conductive material of the electrodes 64 may be supplied to the holes 62 e.g., with plating or sputtering. The electrodes 64 are thus formed on the same side of the laminate substrate 10 as the chip 30 is attached to, in an area that is outside the chip area. Furthermore, the electrodes 64 extend through the insulation body 60 to the surface of the insulation body 60 that is facing away from the laminate substrate 10. Wiring is formed in the conduction layers 12a-d and by the vias 18 of the laminate substrate 10 such that, for each one of the plurality of pads 20 of the laminate substrate 10, said pad 20 is electrically connected with at least one of the electrodes 64.

In a subsequent step, an interconnection body 70, shown in FIG. 7, is formed on the surface of the insulation body 60 and the side of the chip 30 that faces away from the laminate substrate 10. The interconnection body 70 comprises a plurality of pads 72 on the side of the interconnection body 70 that faces away from the electronic chip 30 and the insulation body 60. Furthermore, the interconnection body comprises wiring 74 for electrical connections among the pads 32 of the chip 30, the electrodes 64, and the pads 72 of the interconnection body 70. Hence, a pad 32 of the chip 30 may be electrically connected to a pad 20 of the laminate substrate 10 through a wiring 74, an electrode 64, and a wiring formed in conduction layers 12a-d and vias 18 of the laminate substrate 10, or to a pad 72 of the interconnection body 70 through a wiring 74. Furthermore, although not explicitly shown in the Figures, a pad 20 of the laminate substrate 10 may be electrically connected to a pad 72 of the interconnection body through a wiring in conduction layers 12a-d, vias 18 of the laminate substrate 10, an electrode 64, and a wiring 74 of the interconnection body 70.

The cross section shown in FIG. 7 is a cross section of an electronic device 80 according to an embodiment. The electronic device 80 comprises the chip 30 and a package of the electronic chip 30. The package comprises the laminate substrate 10, the insulation body 60, the electrodes 64, and the interconnection body 70.

The interconnection body 70 may be formed using a thin-film process for generating the pads 72 of the interconnection body 70, the wiring 74 of the interconnection body 70, and electrically insulating material 76 of the interconnection body 70. For example, the interconnection body 70 may be formed by repeatedly performing thin-film deposition, or plating, and selective removal of alternately dielectric and electrically conductive materials. The electrically conductive material may e.g., be a metal or metal alloy. Thin film processes of this kind are known in the art, and are therefore not further described herein.

FIGS. 1-7 show cross-sectional views of the electronic device 80 or parts thereof. To further illustrate embodiments of the present invention, "top" and "bottom" views are provided in FIGS. 8a-c. FIG. 8a shows a view of the laminate substrate 10 from the side on which the pads 20 are located. In FIG. 8a, the pads 20 are evenly distributed over the surface of the laminate substrate 10. However, in other embodiments, the pads 20 may be distributed in other ways than illustrated in FIG. 8a and need not necessarily be evenly distributed over the surface of the laminate substrate 10.

FIG. 8b shows a view of the assembly of FIG. 6 from the side of the laminate substrate 10 on which the insulation body 60, the chip 30, and the electrodes 64 are located. FIG. 8b illustrates an example of how the electrodes 64 may be distributed around the chip 30. However, in other embodiments, the electrodes 64 may be distributed in another way than what is illustrated in FIG. 8b.

FIG. 8c shows a view of the electronic device 80 in FIG. 7 from the side of the electronic device 80 on which the interconnection body 70 is located. In FIG. 8c, the pads 72 are evenly distributed over the surface of the interconnection body 70. However, in other embodiments, the pads 72 may be distributed in other ways than illustrated in FIG. 8c and need not necessarily be evenly distributed over the surface of the interconnection body 70.

Figure 9:
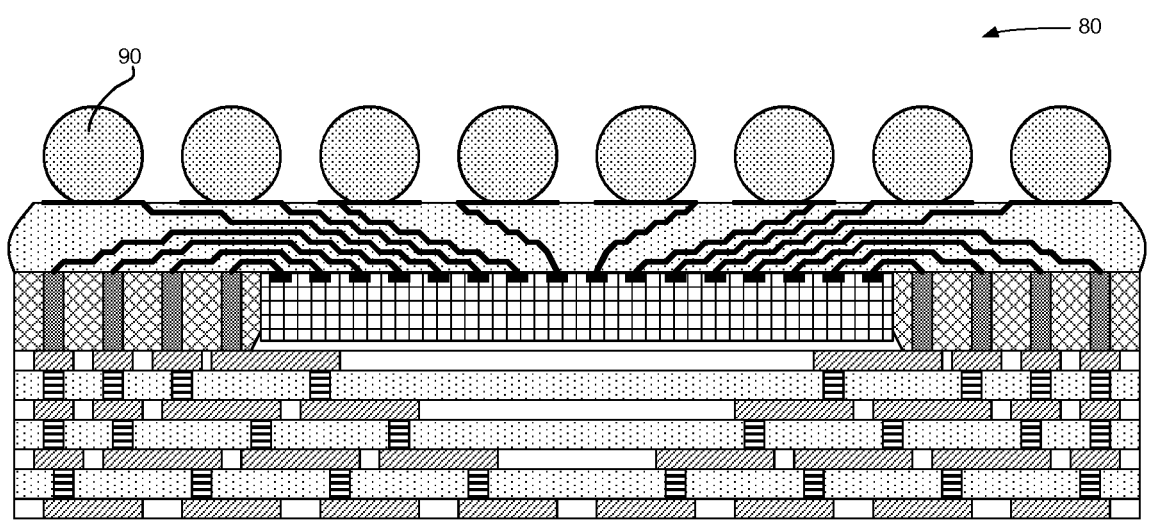

The manufacturing of the electronic device 80 may in some embodiments include an additional step of attaching solder balls 90 to one or more of the pads 72 of the interconnection body 70, as illustrated in FIG. 9. Additionally or alternatively, solder balls (not shown) may be attached to one or more of the pads 20 of the laminate substrate 10.

An advantage of the laminate substrate 10 with multiple conduction layers 12a-d is that the pads 20 may be placed relatively densely, i.e., with a relatively large number of pads 20 per unit area. For example, in comparison with the package disclosed in US 2007/0296065 A 1, where the density of pads of a conductive substrate is limited by the routing capability of the conductive substrate, the pads 20 of the laminate substrate 10 may be placed more densely, e.g., because the pads 20 and the part of or all the wire routing from the pads to the electrodes 64 may be implemented in different conduction layers 12a-d. Hence, the use of the laminate substrate 10 in the electronic device 80 provides for a relatively efficient utilization of space, since a relatively large number of pads 20 can be confined within a relatively small area. Although the routing capability of a laminate substrate 10 with a single conduction layer is not quite as good as for a laminate substrate 10 with multiple conduction layers 12a-d, and therefore does not enable the same pad density as the latter, it still facilitates a higher pad density than e.g., the conductive substrate of US 2007/0296065 A 1, e.g., since the wiring can be made considerably thinner than for the conductive substrate of US 2007/0296065 A1. Furthermore, an embodiment with a laminate substrate 10 having a single conduction layer has the further advantage of a lower thickness than a laminate substrate 10 with multiple conduction layers 12a-d.

Another advantage of the use of the laminate substrate 10 is that the laminate substrate 10 can be produced and tested (e.g., for production errors such as short circuit or open circuit errors) in a separate independent production step before the assembly of the electronic device 80, which is beneficial from a logistics point of view. For example, erroneous laminate substrates 10 can be removed from the production line before assembly of the electronic device 80.

Furthermore, since the laminate substrate 10 may be manufactured using a well established organic BGA manufacturing process, the cost and complexity of manufacturing the laminate substrate 10 can be relatively low.

Moreover, embodiments of the electronic device 80 for which the interconnection body 70 is generated with a thin-film manufacturing process has an advantage that thickness of the electronic device 80 can be made relatively low, thereby providing a further improved utilization of space.

The manufacturing of a single electronic device 80 has been described with embodiments above. However, the electronic device 80 according to embodiments of the present invention is also suitable for parallel manufacturing, such as e.g.; wafer-level packaging. According to an embodiment of the present invention, such parallel manufacturing starts from a panel of a plurality of laminate substrates 10 arranged side by side for forming a plurality of electronic devices 80 arranged side by side. These are then separated, e.g.; by cutting, for forming the individual electronic devices 80.

Figure 11:
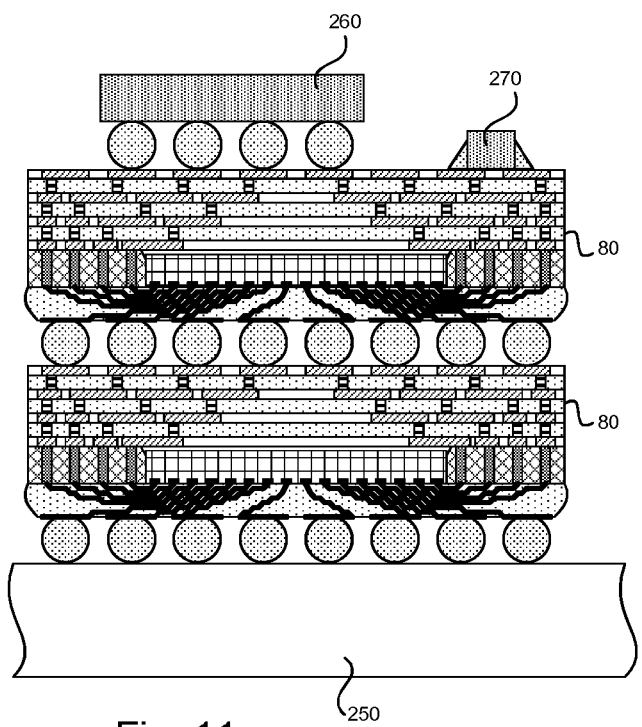
FIG. 11 shows a view of part of an electronic apparatus according to an embodiment of the present invention.
Figure 10:
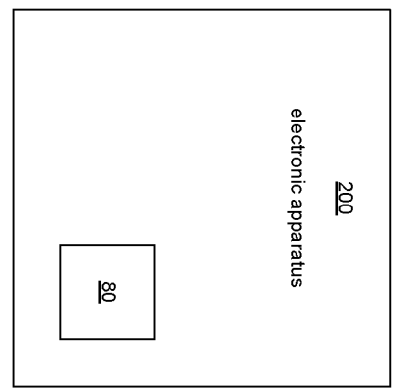
FIG. 10 schematically illustrates an electronic apparatus comprising an electronic device according to an embodiment of the present invention.

According to embodiments of the present invention, the electronic device 80 may be comprised in an electronic apparatus 200, as is schematically illustrated in FIG. 10. In some embodiments, several such electronic devices 80 according to embodiments of the present invention may be comprised in the electronic apparatus 200 and mounted on top of each other in a 3D packaging fashion for efficient utilization of space within the electronic apparatus 200. This is illustrated in FIG. 11 showing two electronic devices 80, a first one mounted on a PCB 250 of the electronic apparatus 200, and a second one mounted on the first one. As is also illustrated in FIG. 11, other passive or active electronic components (e.g., components 260 and 270), may be mounted on one or more of the electronic devices 80 in the electronic apparatus 200. The several electronic devices 80 of the electronic apparatus 200 need not be identical. For example, for different electronic devices 80 within the electronic apparatus 200, the electronic functionality of the chip 30 comprised therein may be different.

Due to the efficient utilization of space, the use of the electronic device 80 can be particularly beneficial in a portable electronic apparatus. Hence, the electronic apparatus 200 may be a portable electronic apparatus, such as but not limited to a mobile telephone, a portable media player, a portable satellite navigation device, e.g.; a portable GPS (Global Positioning System) device, a laptop computer, a pager, a communicator (or electronic organizer), a smart phone, or a personal digital assistant (PDA). However, the electronic device 80 may also be utilized in other types of electronic apparatuses, such as but not limited to a stationary computer or a fixed satellite navigation unit (e.g.; mounted in a vehicle such as a car).

The present invention has been described above with reference to specific embodiments. However, other embodiments than the above described are possible within the scope of the invention. Different method steps than those described above, may be provided within the scope of the invention. The different features and steps of the embodiments may be combined in other combinations than those described. The scope of the invention is only limited by the appended patent claims.

The invention claimed is:

1. An electronic device comprising:
   at least one electronic chip having interconnection pads on a first side of the electronic chip and
   a package for the electronic chip comprising:
   a laminate substrate made from a laminate of one or more conduction layers comprising electrically conductive material and one or more insulation layers of dielectric material, wherein the electronic chip is attached on a first side and in a first area of the laminate substrate with a second side of the electronic chip, opposite to the first side of the electronic chip, facing the first side of the laminate substrate, and the laminate substrate comprises a plurality of pads formed in the conduction layer of the laminate substrate at a second side of the laminate substrate, opposite to the first side of the laminate substrate;
   an insulation body of electrically insulating material formed on the first side of the laminate substrate around the electronic chip, wherein a first surface of the insulation body is essentially coplanar with the first side of the electronic chip;
   a plurality of electrodes of electrically conductive material formed on the first side and in a second area of the laminate substrate, wherein the second area is outside the first area, and the electrodes extend through the insulation body;
   for each pad of said plurality of pads of the laminate substrate, a wiring formed in one or more of the conduction layers of the laminate substrate and one or more electrically conductive vias passing through one or more of the insulation layers of the laminate substrate for electrically connecting the pad with at least one of the electrodes; and
   an interconnection body comprising a single layer formed on the first surface of the insulation body and the first side of the electronic chip, wherein the interconnection body comprises a plurality of pads on a side of the interconnection body opposite to the side of the interconnection body that faces the electronic chip and the insulation body, and at least one wiring for establishing one or more electrical connections between at least two elements selected from the pads of the electronic chip, the electrodes, and the pads of the interconnection body.

2. The electronic device according to claim 1, wherein the interconnection body is a thin-film deposition interconnection body, said wiring of the interconnection body is thin-film deposition wiring, and said electrically insulating material of the interconnection body is thin-film deposition electrically insulating material.

3. The electronic device according to claim 1, wherein at least one of the one or more insulation layers of the laminate substrate comprises a polymer resin material.

4. The electronic device according to claim 3, wherein the polymer resin material is reinforced.

5. The electronic device according to claim 3, wherein the polymer resin material comprises at least one of Ajinomoto Build-up Film, benzocyclobutene, bismaleimide-triazine, epoxy, polyester, polyimide, and TEFLON.

6. The electronic device according to claim 1, wherein the laminate substrate is formed using an organic ball-grid array, (BGA), substrate manufacturing process.

7. The electronic device according to claim 1, wherein the insulation body is a transfer molded insulation body.

8. The electronic device according to claim 1, further comprising at least one solder ball attached to one or more pads of at least one of the interconnection body and the laminate substrate.

9. An electronic apparatus comprising a first electronic device according to claim 1.

10. The electronic apparatus according to claim 9, further comprising a printed circuit board, (PCB), and a second electronic device according to claim 1, wherein the first electronic device is mounted on the PCB and the second electronic device is mounted on the first electronic device in a 3D packaging fashion.

11. The electronic apparatus according to claim 9, wherein the electronic apparatus is a portable electronic apparatus, a mobile telephone, a computer, a portable media player, a satellite navigation device, a pager, a communicator, an electronic organizer, a smart phone, or a personal digital assistant, (PDA).

12. A method for manufacturing the electronic device according to claim 1, comprising:
   attaching the electronic chip to the laminate substrate;
   forming the insulation body with molding;
   forming holes through the insulation body at the locations where the electrodes are to be formed;
   forming the electrodes by supplying the electrically conductive material thereof in said holes formed in the insulation body; and forming the interconnection body by repeatedly performing thin-film deposition and selective removal of alternately dielectric and electrically conductive materials.

13. The method according to claim 12, wherein supplying the electrically conductive material of the electrodes comprises supplying the electrically conductive material with plating or sputtering.

14. The method according to claim 12, further comprising attaching at least one solder balls to one or more pads of at least one of the interconnection body and the laminate substrate.

15. The method according to claim 12, comprising forming the laminate substrate using an organic BGA substrate manufacturing process.

16. The method according to claim 12, wherein forming the insulation body with molding comprises:
  placing the laminate substrate with the electronic chip attached thereto in a transfer mold; and
  injecting a molding compound into the transfer mold for forming the insulation body.

17. A method for manufacturing the electronic device according to claim 1, comprising:
  attaching the electronic chip to the laminate substrate;
  forming the insulation body with molding;
  forming holes through the insulation body at the locations where the electrodes are to be formed;
  forming the electrodes by supplying the electrically conductive material thereof in said holes formed in the insulation body; and
  forming the interconnection body by repeatedly performing plating and selective removal of alternately dielectric and electrically conductive materials.

* * * * *